(12) United States Patent
Yoshikawa

(10) Patent No.: US 9,667,198 B2
(45) Date of Patent: May 30, 2017

(54) POWER AMPLIFIER

(71) Applicant: NEC Corporation, Tokyo (JP)

(72) Inventor: Tsutomu Yoshikawa, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 14/780,826

(22) PCT Filed: Mar. 26, 2013

(86) PCT No.: PCT/JP2013/058731
§ 371 (c)(1),
(2) Date: Sep. 28, 2015

(87) PCT Pub. No.: WO2014/155512
PCT Pub. Date: Oct. 2, 2014

(65) Prior Publication Data
US 2016/0065141 A1    Mar. 3, 2016

(51) Int. Cl.
H03F 3/68 (2006.01)
H03F 1/02 (2006.01)
(Continued)

(52) U.S. Cl.
CPC ............ *H03F 1/0288* (2013.01); *H03F 3/19* (2013.01); *H03F 3/211* (2013.01); *H03F 3/602* (2013.01);
(Continued)

(58) Field of Classification Search
CPC . H03F 1/07; H03F 1/0288; H03F 3/68; H03F 1/3252; H03F 1/06; H03F 3/24;
(Continued)

(56) References Cited

U.S. PATENT DOCUMENTS 5,952,886 A    9/1999   Buer et al.
6,232,840 B1   5/2001   Teeter et al.
(Continued)

FOREIGN PATENT DOCUMENTS

EP    1201028      5/2002
JP    57-125505    8/1982
(Continued)

OTHER PUBLICATIONS

International Search Report, PCT/JP2013/058731, Jun. 18, 2013.
(Continued)

*Primary Examiner* — Steven J. Mottola
*Assistant Examiner* — Hafizur Rahman
(74) *Attorney, Agent, or Firm* — Young & Thompson

(57) ABSTRACT

The disclosed power amplifier has: a first amplifying unit and a second amplifying unit provided with a plurality of amplifying circuits connected in parallel in which a bias voltage can be adjusted in accordance with a control signal supplied from outside, the first amplifying unit and the second amplifying unit for amplifying an input signal by each amplifying circuit and combining and outputting the amplified signal; a divider for dividing the input signal to the first amplifying unit and the second amplifying unit; and a combiner for combining and outputting an output signal of the first amplifying unit and an output signal of the second amplifying unit.

6 Claims, 6 Drawing Sheets

(51) Int. Cl.
*H03F 3/60* (2006.01)
*H03F 3/19* (2006.01)
*H03F 3/21* (2006.01)

(52) U.S. Cl.
CPC .. *H03F 2200/405* (2013.01); *H03F 2200/451* (2013.01); *H03F 2203/21106* (2013.01)

(58) Field of Classification Search
CPC ... H03F 3/60; H03F 3/19; H03F 3/211; H03F 3/602; H03F 2200/405; H03F 2200/451; H03F 2203/21106
USPC ............... 330/84, 86, 124 R, 126, 130, 295; 333/117, 122, 124, 204, 205, 219, 248; 379/338, 443; 455/127.1, 143
See application file for complete search history.

(56) References Cited

U.S. PATENT DOCUMENTS

| | | | |
|---|---|---|---|
| 6,388,528 | B1 | 5/2002 | Buer et al. |
| 7,453,320 | B2 | 11/2008 | Shiikuma |
| 7,764,120 | B2 | 7/2010 | Pengelly |
| 8,154,339 | B2 | 4/2012 | Zolghadri et al. |
| 8,269,559 | B2 | 9/2012 | Tadano |
| 2007/0103237 | A1 | 5/2007 | Shiikuma |
| 2009/0045877 | A1 | 2/2009 | Wang et al. |
| 2010/0052779 | A1* | 3/2010 | Shin ................... H03F 1/0288 330/124 R |
| 2011/0140775 | A1 | 6/2011 | Hong et al. |
| 2011/0316633 | A1 | 12/2011 | Tadano |
| 2012/0025915 | A1 | 2/2012 | Ui |
| 2013/0021104 | A1 | 1/2013 | Schmidt |
| 2014/0312976 | A1* | 10/2014 | Noori ................... H03F 1/0288 330/295 |

FOREIGN PATENT DOCUMENTS

| | | | |
|---|---|---|---|
| JP | 2001-185967 | | 7/2001 |
| JP | 2001185967 | A * | 7/2001 |
| JP | 2002-344247 | | 11/2002 |
| JP | 2006-135528 | | 5/2006 |
| JP | 2008-306771 | | 12/2008 |
| JP | 2011-211655 | | 10/2011 |
| JP | 2011211655 | A * | 10/2011 |
| JP | 2012-015602 | | 1/2012 |
| JP | 2012-100020 | | 5/2012 |
| JP | 2012100020 | A * | 5/2012 |
| WO | 00/45508 | | 8/2000 |
| WO | 02/25810 | | 3/2002 |
| WO | 2008/012898 | | 1/2008 |
| WO | WO 2010/021957 | | 2/2010 |

OTHER PUBLICATIONS

Supplementary Partial European Search Report dated Oct. 27, 2016 in corresponding European Patent Application No. 13880270.7.
Kimberley W. Eccleston: "Integrated Combined Amplifiers for Planar Circuits", 2008 IEEE MTT-S International Microwave Workshop Series on Art of Miniaturizing RF and Microwave Passive Components, Piscataway, NJ, USA, Dec. 14, 2008, pp. 26-29, XP031424207, ISBN: 978-1-4244-2876-2.
European Search Report—EP 13 88 0270—Feb. 3, 2017.
Japanese Official Action—2015-507731—Feb. 21, 2017.

* cited by examiner

POWER AMPLIFIER

TECHNICAL FIELD

The present invention relates to a power amplifier used for power amplification of an RF (Radio Frequency) signal.

BACKGROUND ART

A power amplifier used for a wireless communication system and the like needs to have high linearity and high efficiency for input/output characteristics. On the other hand, a recent wireless communication system frequently handles a signal in which the average value of signal amplitudes and the maximum amplitude are different to a large extent, due to use of a multi-value digital modulation system or the like. When such a signal is amplified, an operation point of a transistor is set to be able to amplify the signal up to the maximum amplitude without distortion in a conventional power amplifier. Therefore, in the power amplifier, there remains substantially no period of time for the transistor that operates with relatively high efficiency to operate around a saturation output level, resulting in a decrease in efficiency.

To solve this problem, conventionally, techniques for increasing an efficiency of a power amplifier with maintaining linearity have been studied. As one of the techniques thereof, a Doherty amplifier is available.

FIG. 1 is a block diagram illustrating a configuration example of a Doherty amplifier.

As illustrated in FIG. 1, a Doherty amplifier 1 includes a main amplifier 2 that always carries out an amplification operation of a signal, a peak amplifier 3 that operates during high power output, a divider 4 that divides an input signal to the main amplifier 2 and the peak amplifier 3, and a combiner 5 that combines an output signal of the main amplifier 2 and an output signal of the peak amplifier 3 and outputs the combined signal.

For the main amplifier 2, there is used an amplifying circuit including one transistor or a push-pull amplifying circuit including two transistors, and the amplifying circuit is usually biased so as to operate in AB-class or B-class mode.

For the peak amplifier 3, there is used an amplifying circuit including one transistor or a push-pull amplifying circuit including two transistors, and the amplifying circuit is usually biased so as to operate in C-class mode.

The divider 4 equally divides power of an input signal to the main amplifier 2 and the peak amplifier 3 and delays a phase of the signal supplied to the peak amplifier 3 by 90 degrees with respect to a phase of the signal supplied to the main amplifier 2. For the divider 4, for example, a well-known 3-dB coupler is used. The 3-dB coupler includes four input/output terminals, an RF signal is input from one input terminal, and the other input terminal is grounded via a terminating resistance. From one output terminal of the 3-dB coupler, a signal having the same phase as the input signal is output and supplied to the main amplifier 2. From the other output terminal of the 3-dB coupler, a signal delayed by 90 degrees with respect to the input signal is output and supplied to the peak amplifier 3.

For the combiner 5, for example, a well-known quarter wavelength transmission line (quarter wavelength line) is used so that an output signal of the main amplifier 2 and an output signal of the peak amplifier 3 are combined in phase. The quarter wavelength line is realized with a print pattern formed on a printed circuit board. The Doherty amplifier 1 is described also in, for example, PTL 1.

When a power amplifier that outputs large power is realized using the Doherty amplifier 1 illustrated in FIG. 1, a plurality of Doherty amplifiers 1 are generally provided, the same signal is divided to each Doherty amplifier 1, and output signals of each Doherty amplifier 1 are combined to be output. Such a power amplifier that outputs large power is being considered to be used as a power amplifier for, for example, a television transmitter that transmits television broadcast signals. FIG. 2 illustrates a configuration example of a power amplifier of the background technique including the plurality of Doherty amplifiers 1.

FIG. 2 is a block diagram illustrating a configuration example of the power amplifier of the background technique.

As illustrated in FIG. 2, a power amplifier 10 of the background technique includes an RF signal input port 11, a variable attenuator 12, a variable phase shifter 13, a driver stage 14, an n (n is a positive integer equal to or greater than 2) divider 15, a final stage 16, an n combiner 17, and an RF signal output port 18.

FIG. 2 illustrates an example in which the driver stage 14 includes one Doherty amplifier 1 and the final stage 16 includes n Doherty amplifiers 1 connected in parallel. As described above, a main amplifier of each Doherty amplifier 1 included in the driver stage 14 and the final stage 16 is biased so as to operate in AB-class or B-class mode, and a peak amplifier thereof is biased so as to operate in C-class mode.

The variable attenuator 12 is configured to be settable for a desired attenuation amount by a control signal supplied from outside and attenuates an RF signal input from the RF signal input port 11 and outputs the attenuated RF signal.

The variable phase shifter 13 is configured to be settable for a desired phase shift amount by a control signal supplied from outside and delays a phase of the RF signal output from the variable attenuator 12 and outputs the resulting RF signal.

The driver stage 14 amplifies the RF signal output from the variable phase shifter 13 and outputs the amplified RF signal to the n divider 15.

The n divider 15 divides the RF signal supplied from the driver stage 14 to the n Doherty amplifiers 1 included in the final stage 16.

The final stage 16 amplifies the RF signals divided by the n divider 15 using the n Doherty amplifiers 1, respectively.

The n combiner 16 combines the RF signals amplified by each Doherty amplifier 1 included in the final stage 16 and outputs the combined RF signal from the RF signal output port 18.

In the Doherty amplifier 1 illustrated in FIG. 1, when the peak amplifier 3 does not operate, in other words, when a level of an input signal is low, an impedance of the output terminal of the peak amplifier 3 viewed from the output terminal of the main amplifier 2 needs to be open. When the impedance of the output terminal of the peak amplifier 3 is not open, a part of an output power of the main amplifier 2 sneaks to the peak amplifier 3 and then an output power of the combiner 5 decreases only by a portion thereof, resulting in occurrence of a power loss. The quarter wavelength line configuring the combiner 5 is also used to cause the impedance of the output terminal of the peak amplifier 3 viewed from the output terminal of the main amplifier 2 to be open. However, the quarter wavelength line is produced by determining a substrate material and a physical line length in accordance with a used frequency band so that characteristics thereof strongly depends on the frequency, resulting in a problem in which a usable frequency range is limited.

On the other hand, for example, a television broadcast signal has a wide frequency range used as a carrier (170-230 MHz for the VHF band and 470-862 MHz for the UHF band) so that, when the power amplifier 10 including a plurality of Doherty amplifiers illustrated in FIG. 2 is used for a television transmitter, it is difficult for the power amplifier 10 to cover the entire frequency band of the VHS band or the UHF band.

As a countermeasure for such a problem, it is conceivable that there is a configuration in which, for example, the VHF band or the UHF band is divided into a plurality of frequency bands and the power amplifier 10 dedicated for each frequency band is provided.

However, for such a configuration, components (the divider 4, the main amplifier 2, the peak amplifier 3, the combiner 5, and the like) different for each frequency band need to be produced, resulting in an increase in production cost. Further, it is difficult to start production until determining, for example, how the entire frequency band to be amplified is divided, resulting in a decrease in the production efficiency of the power amplifier 10.

A television broadcast is an important social infrastructure so that pieces of backup equipment are usually provided so as to prevent a sudden stop of broadcasting due to an equipment failure. Therefore, in a configuration in which the power amplifier 10 dedicated for each of a plurality of frequency bands is provided, a user managing a television transmitter prepares backup components for each of the plurality of frequency bands. Accordingly, a purchasing expense regarding the television transmitter by the user increases and also the maintenance of each power amplifier 10 is cumbersome.

In recent years, transistors operating even at a higher frequency have been developed, and the main amplifier 2 and the peak amplifier 3 capable of covering the entire band even in the VHF band or the UHF band have been realizable. Further, regarding the divider 4, the divider 4 operating with a required performance in a relatively wide frequency band has been realizable, similarly to a well-known Wilkinson power divider circuit.

However, regarding the quarter wavelength line used in the combiner 5 of the Doherty amplifier 1 (hereinafter, referred to as the "Doherty combiner"), a physical line length is determined in accordance with a substrate material and a frequency band so that when, for example, a frequency band to be used is changed, a printed circuit board or the like where a quarter wavelength line is formed needs to be exchanged. Alternatively, processing for the printed circuit board such as cutting or extending of the quarter wavelength line is necessary.

Accordingly, in a configuration in which a plurality of Doherty amplifiers is provided to realize a power amplifier that outputs large power and such a power amplifier is prepared for each of a plurality of frequency bands, it is necessary to exchange or process a large number of printed circuit boards each time a frequency band to be used is changed, resulting in very cumbersome operations.

CITATION LIST

Patent Literature

[PTL 1] Japanese Laid-open Patent Publication No. 2008-306771

SUMMARY OF INVENTION

Therefore, an object of the present invention is to provide a power amplifier capable of reducing production cost and of easily coping with even a change of a used frequency band.

To achieve the object described above, a power amplifier includes:

a first amplifying unit and a second amplifying unit that each includes a plurality of amplifying circuits connected in parallel wherein a bias voltage is adjustable in accordance with a control signal supplied from outside, amplifies an input signal using the plurality of amplifying circuits, combines the amplified signals, and outputs the combined signal;

a divider that divides an input signal to the first amplifying unit and the second amplifying unit; and a combiner that combines an output signal of the first amplifying unit and an output signal of the second amplifying unit and outputs the combined signal, wherein each of the plurality of amplifying circuits included in the first amplifying unit is biased so as to operate in AB-class or B-class mode, each of the plurality of amplifying circuits included in the second amplifying unit is biased so as to operate in C-class mode, and the combiner combines the output signal of the first amplifying unit and the output signal of the second amplifying unit to cause the first amplifying unit and the second amplifying unit to operate as a Doherty amplifier.

Alternatively, when m is a positive integer equal to or greater than 2, a power amplifier of the present invention includes:

m sets that each includes:

a first amplifying unit and a second amplifying unit that each comprises a plurality of amplifying circuits connected in parallel wherein a bias voltage is adjustable in accordance with a control signal supplied from outside, amplifies an input signal by the plurality of amplifying circuits, combines the amplified signals, and outputs the combined signal, a divider that divides an input signal to the first amplifying unit and the second amplifying unit, and a combiner that combines an output signal of the first amplifying unit and an output signal of the second amplifying unit and outputs the combined signal;

an m divider that divides an input signal to each of m units of the divider; and an m combiner that combines output signals of the m sets of the first amplifying unit and the second amplifying unit and outputs the combined signal.

DESCRIPTION OF EMBODIMENTS

The present invention will now be described with reference to the accompanying drawings.

(First Exemplary Embodiment)

Figure 3:
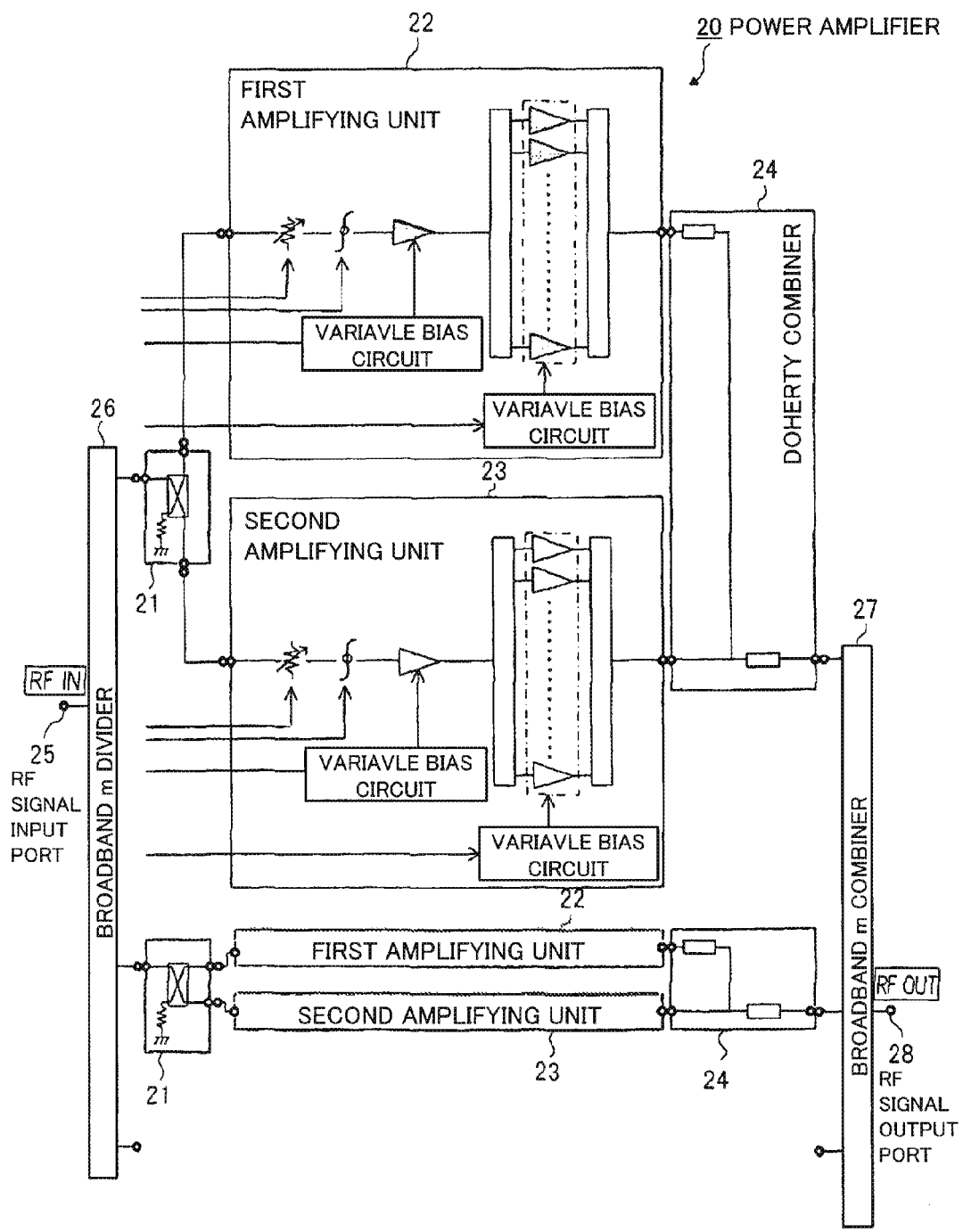
FIG. 3 is a block diagram illustrating one configuration example of a power amplifier according to a first exemplary embodiment.
Figure 4:
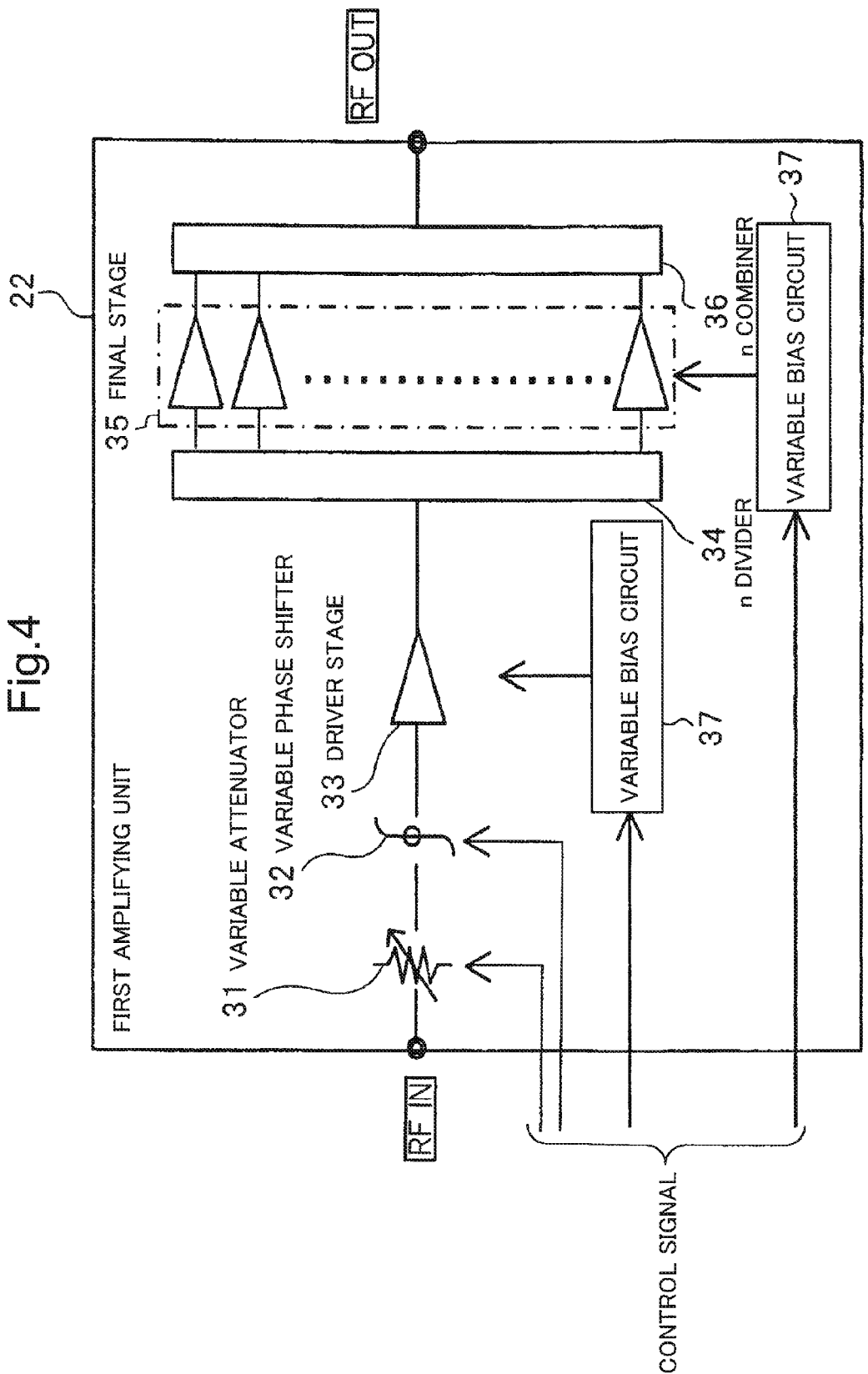
FIG. 4 is a block diagram illustrating one configuration example of an amplifying unit illustrated in FIG. 3.

FIG. 3 is a block diagram illustrating one configuration example of a power amplifier according to a first exemplary embodiment, and FIG. 4 is a block diagram illustrating one configuration example of an amplifying unit illustrated in FIG. 3.

As illustrated in FIG. 3, a power amplifier 20 of the first exemplary embodiment includes m (m is a positive integer equal to or greater than 2) sets of an divider 21, a first amplifying unit 22, a second amplifying unit 23, and a Doherty combiner 24, and further includes an RF signal input port 25, a broadband m divider 26, a broadband m combiner 27, and an RF signal output port 28.

In the power amplifier of the first exemplary embodiment, the first amplifying unit 22 operates as a main amplifier and the second amplifying unit 23 operates as a peak amplifier, and thereby m sets of the first amplifying unit 22 and the second amplifying unit 23 each operate as a Doherty amplifier.

The present exemplary embodiment illustrates an example in which m sets of the first amplifying unit 22 and the second amplifying unit 23 each operate as a Doherty amplifier, but as illustrated in a second exemplary embodiment to be described later, all of the m sets of the first amplifying unit 22 and the second amplifying unit 23 need not operate as Doherty amplifiers. In this case, at least one or more sets of the first amplifying unit 22 and the second amplifying unit 23 may operate as Doherty amplifiers.

FIG. 3 illustrates a configuration example including two sets (m=2) of the first amplifying units 22 and the second amplifying units 23. However, the power amplifier of the present exemplary embodiment may include one or more sets of the first amplifying unit 22 and the second amplifying unit 23, and the number of sets of the first amplifying unit 22 and the second amplifying unit 23 may be set, for example, in accordance with a needed RF output. When the power amplifier includes only one set of the first amplifying unit 22 and the second amplifying unit 23, the broadband m divider 26 and the broadband m combiner 27 are unnecessary.

The first amplifying unit 22 and the second amplifying unit 23 each include n (n is a positive integer) amplifying circuits connected in parallel. For each of the n amplifying circuits included in the first amplifying unit 22, an amplifying circuit including one transistor or a push-pull amplifying circuit including two transistors is used, and the amplifying circuit is configured to be biased by a control signal supplied from outside so as to operate in AB-class or B-class mode.

In the same manner, for each of the n amplifying circuits included in the second amplifying unit 23, an amplifying circuit including one transistor or a push-pull amplifying circuit including two transistors is used, and the amplifying circuit is configured to be biased by a control signal supplied from outside so as to operate in C-class mode.

An RF signal is input to the first amplifying unit 22 and the second amplifying unit 23 forming a pair via a corresponding divider 21, and output signals of the first amplifying unit 22 and the second amplifying unit 23 are combined by a corresponding Doherty combiner 24 to be output.

The divider 21 equally divides power of the input signal to the first amplifying unit 22 and the second amplifying unit 23 forming a pair and delays a phase of the signal supplied to the second amplifying unit 23 that operates as a peak amplifier by 90 degrees with respect to a phase of the signal supplied to the first amplifying unit 22 that operates as a main amplifier.

For the divider 21, a well-known 3-dB coupler usable in a relatively wide frequency band is used. For the divider 21, a well-known Wilkinson power divider circuit or a power divider circuit of a multi-stage coupler cascade-connected type to be described later may be used. When a Wilkinson power divider circuit is used as the divider 21, a circuit that delays a phase of a signal supplied to the peak amplifier 3 by 90 degrees with respect to a phase of a signal supplied to the main amplifier 2 may be provided.

Figure 1:
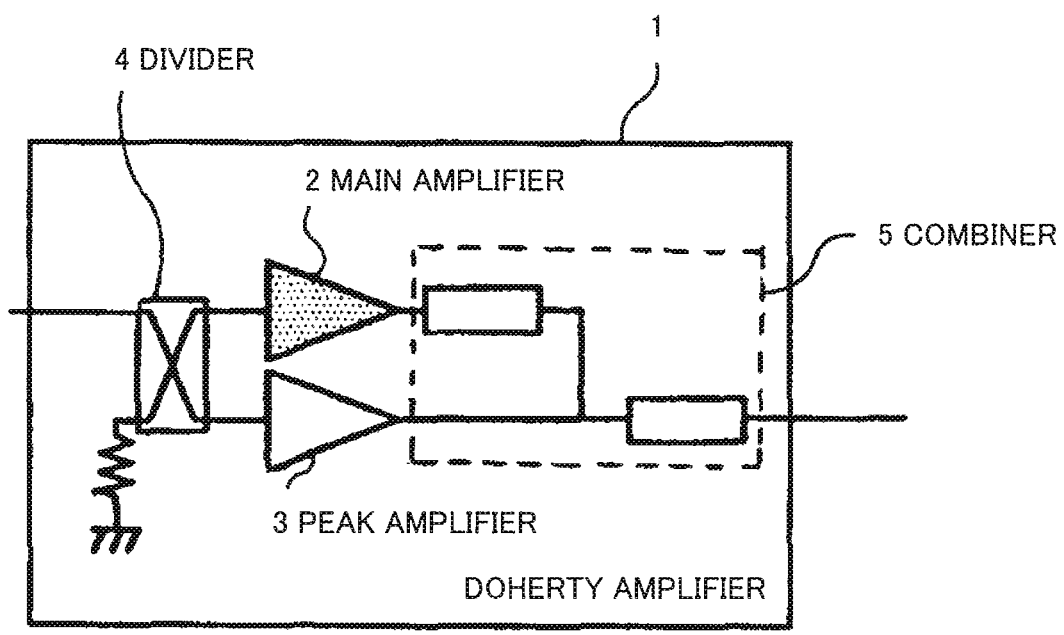
FIG. 1 is a block diagram illustrating a configuration example of a Doherty amplifier.
Figure 2:
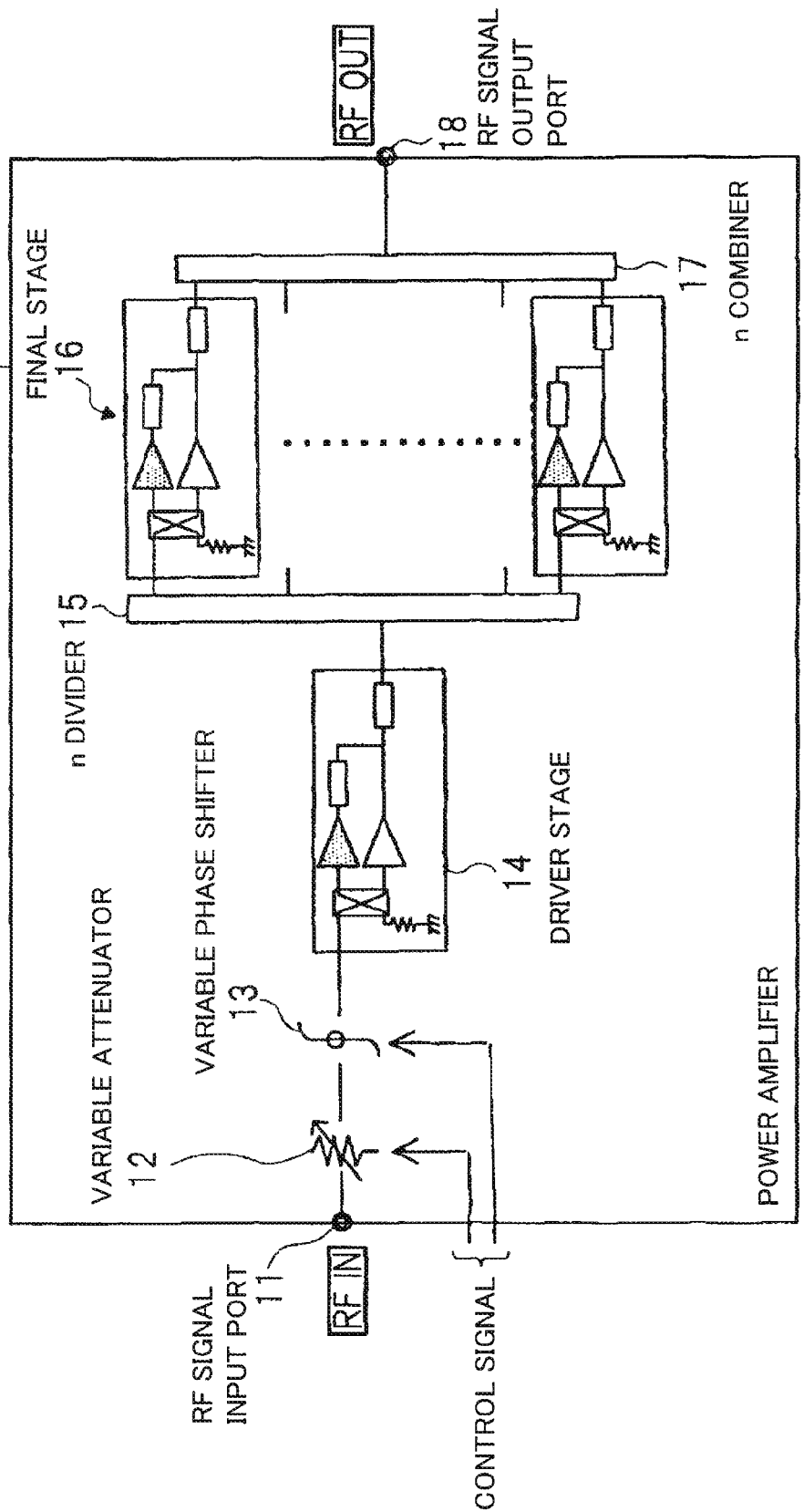
FIG. 2 is a block diagram illustrating a configuration example of a power amplifier of the background technique.

For the Doherty combiner 15, a well-known quarter wavelength transmission line (quarter wavelength line) is used in the same manner as for the Doherty amplifier illustrated in FIG. 1.

The broadband m divider 26 divides an RF signal input from the RF signal input port 25 to each of the m units of the divider 21 with equal power. For the broadband m divider 26, a well-known Wilkinson power divider circuit usable in a relatively wide frequency band may be used.

The broadband m combiner 27 combines RF signals output from m units of the Doherty combiner 24 and outputs the combined RF signal from the RF signal output port 28. In the broadband m combiner 27, it is unnecessary to consider an impedance of the output terminal of a peak amplifier viewed from the output terminal of a main amplifier as in the Doherty combiner so that a well-known Wilkinson combiner circuit usable in a relatively wide frequency band may be used.

For the broadband m divider 26 and the broadband m combiner 27, usable are a power divider circuit and a combiner circuit of a multi-stage coupler cascade-connected type corresponding to a wide frequency band by cascade-connecting a plurality of quarter wavelength couplers different in coupling degree in accordance with the number of dividers and combiners, respectively. Use of a three-quarter wavelength coupler may also cause the power divider circuit and the combiner circuit of a multi-stage coupler cascade-connected type to cover a wider frequency band.

As illustrated in FIG. 4, the first amplifying unit 22 includes a variable attenuator 31, a variable phase shifter 32, a driver stage 33, an n divider 34, a variable bias circuit 37, a final stage 35, and an n combiner 36. FIG. 4 illustrates a configuration example of the first amplifying unit 22, but the second amplifying unit 23 illustrated in FIG. 3 is configured in the same manner. In the following description, the first amplifying unit 22 and second amplifying unit 23 thereof are collectively referred to as an "amplifying unit" in some cases.

It may be unnecessary to include the variable attenuator 31 and the variable phase shifter 32 when a gain adjustment and a phase adjustment made by the first amplifying unit 22 and the second amplifying unit 23 are unnecessary.

It is assumed that the amplifying unit of the present exemplary embodiment is configured so that the variable attenuator 31, the variable phase shifter 32, the driver stage 33, the n divider 34, the final stage 35, and the n combiner 36 described above are usable in a relatively wide frequency band and also is configured to operate with a desired performance (to be able to operate with maintaining a desired peak power and efficiency) even when a used frequency band is changed. The "wide frequency band" referred to in the present description is assumed to indicate, for example, the VHF band or UHF band described above.

FIG. 4 illustrates an example in which the driver stage 33 includes one amplifying circuit and the final stage 35 includes n amplifying circuits connected in parallel. The driver stage 33 may be configured to include a plurality of amplifying circuits connected in parallel.

As described above, for each amplifying circuit included in the driver stage 33 and the final stage 35, a bias voltage supplied to the input terminal of a transistor via the variable bias circuit 37 is set to be a needed value by a control signal supplied from outside. In the case of the first amplifying unit 22, a transistor of each amplifying circuit included in the final stage 35 is usually biased so as to operate in AB-class or B-class mode. In the case of the second amplifying unit 23, a transistor of each amplifying circuit included in the final stage 35 is usually biased so as to operate in C-class mode.

A transistor of the amplifying circuit included in the driver stage 33 is usually biased so as to operate in AB-class or B-class mode with respect to both the first amplifying unit 22 and the second amplifying unit 23. The variable bias circuit 37 can be realized using a well-known regulator IC (Integrated Circuit) or the like.

The variable attenuator 31 can be set to a desired attenuation amount by a control signal supplied from outside, and attenuates an RF signal input from the divider 21 by a needed amount and outputs the attenuated RF signal. The variable attenuator 31 is used for a gain adjustment of the amplifying unit. The variable attenuator 31 may be realized using, for example, a well-known variable capacity diode or the like.

The variable phase shifter 32 can be set to a desired phase shift amount by a control signal supplied from outside, and delays a phase of an RF signal output from the variable attenuator 31 by a needed amount and outputs the resulting RF signal. The variable phase shifter 32 is used for adjusting a signal phase between the input/output ports of the amplifying unit. The variable phase shifter 32 may be realized using, for example, a well-known variable capacity diode or the like.

A control signal for setting an attenuation amount of the variable attenuator 31, a control signal for setting a phase shift amount of the variable phase shifter 32, a control signal for setting a bias voltage of the driver stage 33, and a control signal for setting a bias voltage of the final stage 35 may be supplied from, for example, a control device (information processing device) included in a transmitter including the power amplifier 20 illustrated in FIG. 3.

The driver stage 33 amplifies an RF signal output from the variable phase shifter 32 and outputs the amplified RF signal to the n divider 34. It may be unnecessary to include the driver stage 33 when it is possible that power of the RF signal output from the variable phase shifter 32 is sufficiently large and the RF signal with sufficient power is divided to each amplifying circuit included in the final stage 35 via the n divider 34.

The n divider 34 divides the RF signal output from the driver stage 33 to the n amplifying circuits included in the final stage 35.

The final stage 35 amplifies the RF signals divided by the n divider 34 using the n amplifying circuits connected in parallel and outputs the amplified RF signals.

The n combiner 36 combines the RF signals amplified by the n amplifying circuits included in the final stage 35 and outputs the combined RF signal. For the n combiner 36, a combiner circuit in which an impedance viewed from the output port of the amplifying unit is an impedance of a transistor included in the final stage 35 needs to be used when a Doherty amplifier is realized by the first amplifying unit 22 and the second amplifying unit 23. As such an n combiner 36, a well-known Wilkinson power combiner circuit is available.

When, for example, a well-known 3-dB coupler is used for the n combiner 36, an impedance viewed from the output port of the amplifying unit is 50Ω so that it is difficult to realize a Doherty amplifier using the first amplifying unit 22 and the second amplifying unit 23. Also when a well-known isolator is inserted between the final stage 35 and the n combiner 36, an impedance viewed from the output port of the amplifying unit is 50Ω so that it is necessary to be careful when a Doherty amplifier is realized by the first amplifying unit 22 and the second amplifying unit 23.

Figure 5:
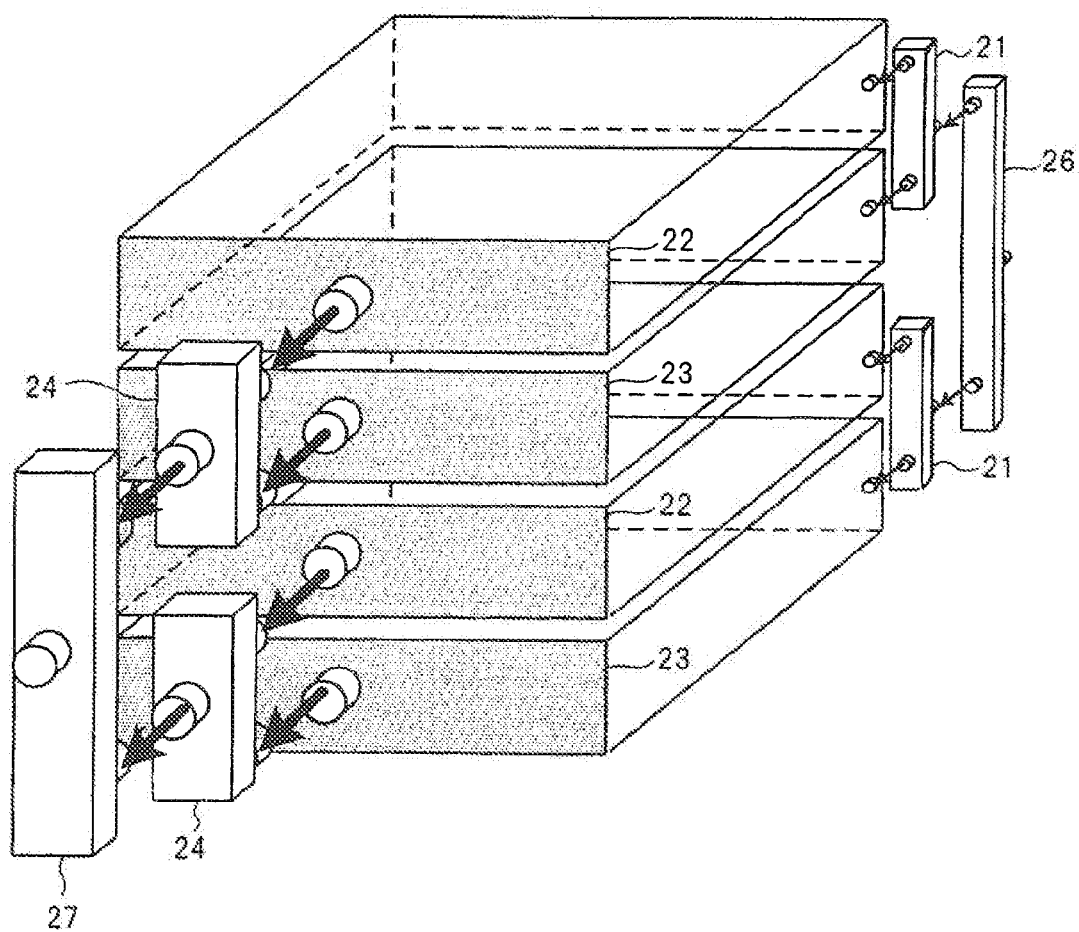
FIG. 5 is a perspective view illustrating a mounting example of the power amplifier according to the first exemplary embodiment illustrated in FIG. 3.

FIG. 5 is a perspective view illustrating a mounting example of the power amplifier of the first exemplary embodiment illustrated in FIG. 3. FIG. 5 illustrates a mounting example in which the power amplifier includes 2 sets (m=2) of the first amplifying unit 22 and the second amplifying unit 23.

As illustrate in FIG. 5, the power amplifier 20 of the present exemplary embodiment is configured so that the first amplifying unit 22, the second amplifying unit 23, the divider 21, the broadband m divider 26, the Doherty combiner 24, and the broadband m combiner 27 are each accommodated in individual housings.

The m sets of the first amplifying unit 22 and the second amplifying unit 23 are sequentially loaded, the divider 21 is attached to the input ports of the first amplifying unit 22 and the second amplifying unit 23 forming a pair, and the broadband m divider 26 is attached to the input ports of the respective dividers 21.

The Doherty combiner 24 is attached to the output ports of the first amplifying unit 22 and the second amplifying unit 23 forming a pair, and the broadband m combiner 27 is attached to the output ports of the respective Doherty combiners 24.

In such a configuration, as described above, the power amplifier 20 of the present exemplary embodiment is configured so that the first amplifying unit 22, the second amplifying unit 23, the divider 21, the broadband m divider 26, and the broadband m combiner 27 are usable in a relatively wide frequency band, and only the Doherty combiner 24 is a circuit in which a used frequency band is limited.

Therefore, in the power amplifier 20 of the present exemplary embodiment, it is enough to change only the Doherty combiner 24 in accordance with a used frequency band, and other units such as the first amplifying unit 22, the second amplifying unit 23, the divider 21, the broadband m divider 26, and the broadband m combiner 27 are commonly usable. Therefore, a large number of the components thereof can be produced in advance, resulting in a reduction in the production cost of the power amplifier.

As illustrated in FIG. 5, the first amplifying unit 22, the second amplifying unit 23, the divider 21, the Doherty combiner 24, the broadband m divider 26, and the broadband m combiner 27 are each accommodated in different housings so that the Doherty combiner 24 is easily exchangeable.

In the present exemplary embodiment, a bias voltage of each amplifying circuit included in the first amplifying unit 22 and the second amplifying unit 23 is made adjustable from outside, and thereby a Doherty amplifier can be realized by the first amplifying unit 22 and the second amplifying unit 23, resulting in obtaining the power amplifier 20 with high efficiency.

A signal phase between the input/output ports of the first amplifying unit 22 and the second amplifying unit 23, a gain, and a bias voltage are made adjustable from outside, and thereby, even when a used frequency band of the first amplifying unit 22 and the second amplifying unit 23 is changed, the power amplifier 20 of the present exemplary embodiment can easily follow the change.

(Second Exemplary Embodiment)

Figure 6:
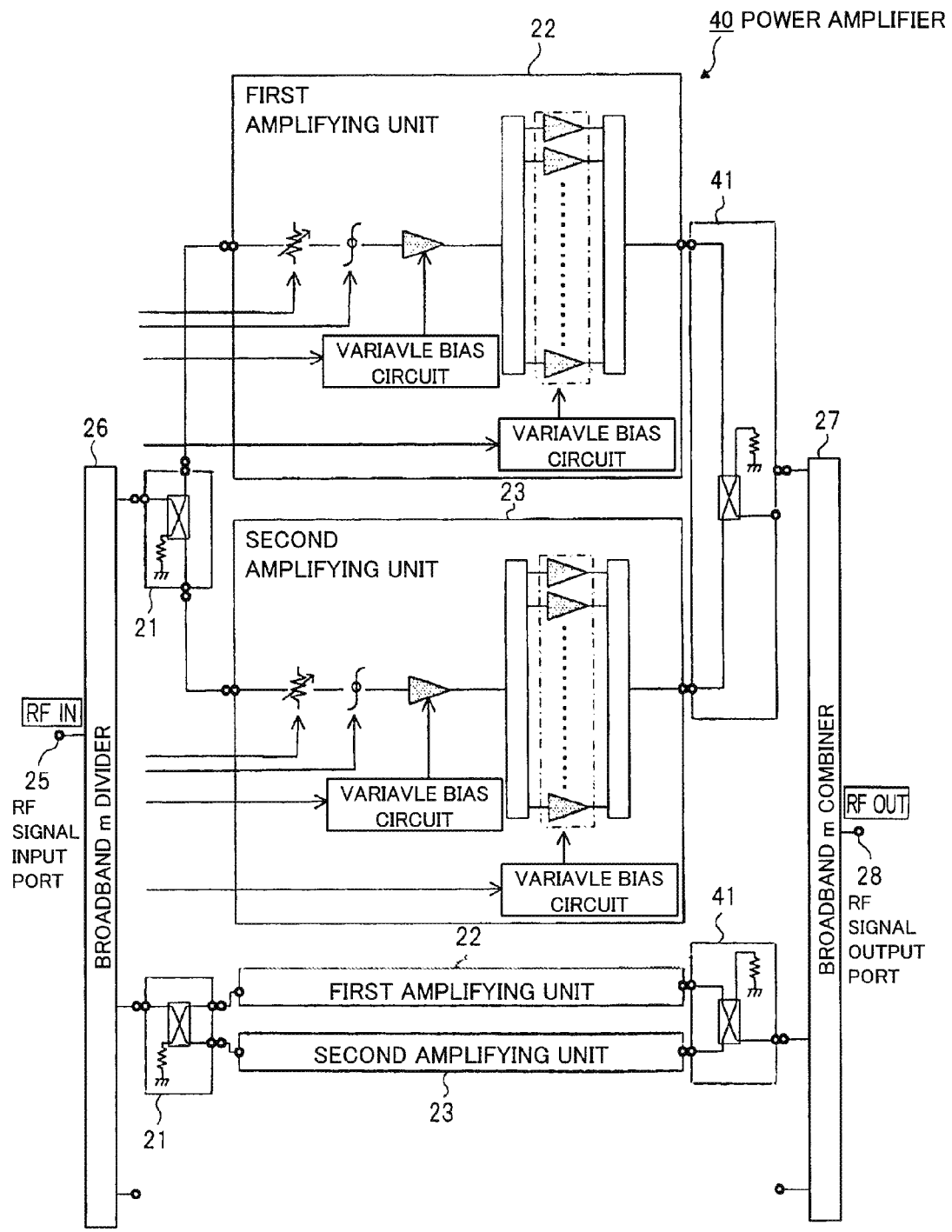
FIG. 6 is a block diagram illustrating one configuration example of a power amplifier according to a second exemplary embodiment.

FIG. 6 is a block diagram illustrating one configuration example of a power amplifier of a second exemplary embodiment.

As illustrated in FIG. 6, a power amplifier 40 of the second exemplary embodiment includes a combiner 41 usable in a relatively wide frequency band similarly to a 3-dB coupler and the like, instead of the Doherty combiner 24 included in the power amplifier 20 of the first exemplary embodiment illustrated in FIG. 3.

In the power amplifier 40 of the second exemplary embodiment, the combiner 41 usable in a relatively wide frequency band similarly to a 3-dB coupler and the like is used instead of the Doherty combiner 24, and thereby it is difficult that the first amplifying unit 22 and the second amplifying unit 23 which correspond to the combiner 41 realize a Doherty amplifier. In this case, the first amplifying unit 22 and the second amplifying unit 23 are each caused to operate as a main amplifier (linear amplifier).

FIG. 6 illustrates a configuration example in which the combiner 41 is provided correspondingly to each of two sets (m=2) of the first amplifying unit 22 and the second amplifying unit 23, but it is unnecessary that every set of the first amplifying unit 22 and the second amplifying unit 23 is provided with a corresponding combiner 41. In this case, the first amplifying unit 22 and the second amplifying unit 23 for which the combiner 41 is not disposed may be provided with the Doherty combiner 24 to be operated as a Doherty amplifier. Other configurations and operations are the same as in the first exemplary embodiment, and therefore description thereof will be omitted.

In such a configuration, the first amplifying unit 22 and the second amplifying unit 23 provided with the combiner 41 are caused to operate in AB-class or B-class mode so that efficiency is reduced compared with the power amplifier 20 illustrated in the first exemplary embodiment.

However, it is possible for the power amplifier 40 of the second exemplary embodiment to include the first amplifying unit 22 and the second amplifying unit 23 usable in a relatively wide frequency band.

In a configuration including, for example, a plurality of sets of the first amplifying unit 22 and the second amplifying unit 23 corresponding to different frequency bands, there is known a configuration referred to as an N+1 system in which one set of the first amplifying unit 22 and the second amplifying unit 23 is used as a backup system. An amplifying unit used as the backup system thereof needs to cover the entire frequency band to be amplified by the power amplifier 40.

As described above, it is possible for the power amplifier 40 of the second exemplary embodiment to include the first amplifying unit 22 and the second amplifying unit 23 usable in a relatively wide frequency band so that the N+1 system including a backup system can be realized.

As described in the first exemplary embodiment, the power amplifier 40 of the present exemplary embodiment is also configured so that the first amplifying unit 22, the second amplifying unit 23, the divider 21, the combiner 41, the broadband m divider 26, and the broadband m combiner 27 are each accommodated in individual housings. Therefore, the Doherty combiner 24 is easily exchanged to the combiner 41, and the power amplifier 40 of the present exemplary embodiment can be easily realized.

In the same manner as in the power amplifier 20 of the first exemplary embodiment, the first amplifying unit 22, the second amplifying unit 23, the divider 21, the broadband m divider 26, and the broadband m combiner 27 are commonly usable also in the power amplifier 40 of the second exemplary embodiment so that a large number of the components thereof can be produced in advance, resulting in a reduction in the production cost of the power amplifier 40.

Further, in the same manner as in the first exemplary embodiment, when a used frequency band is changed in the first amplifying unit 22 and the second amplifying unit 23 caused to operate as a Doherty amplifier, only the Doherty combiner 24 may be changed in accordance with the used frequency band and a signal phase between the input/output ports, a gain, and a bias voltage may be adjusted from outside, also in the power amplifier 40 of the second exemplary embodiment. Therefore, it is possible to easily cope with even a case where a used frequency band of the first amplifying unit 22 and the second amplifying unit 23 caused to operate as a Doherty amplifier is changed.

While the present invention has been described with reference to exemplary embodiments thereof, the present invention is not limited to the exemplary embodiments described above. The constitution and details of the present invention can be subjected to various modifications which can be understood by those skilled in the art, within the scope of the present invention.

The invention claimed is:

1. A power amplifier comprising:
   m (m is a positive integer equal to or greater than 2) sets that each comprises:
      a first amplifying unit and a second amplifying unit that each comprises a plurality of amplifying circuits connected in parallel wherein a bias voltage is adjustable in accordance with a control signal supplied from outside, amplifies an input signal by the plurality of amplifying circuits, combines the amplified signals, and outputs the combined signal;
      a divider that divides an input signal to the first amplifying unit and the second amplifying unit; and
      a combiner that combines an output signal of the first amplifying unit and an output signal of the second amplifying unit and outputs the combined signal;
   an m divider that divides an input signal to each of m units of the divider; and
   an m combiner that combines output signals of the m sets of the first amplifying unit and the second amplifying unit and outputs the combined signal,
   wherein the first amplifying unit, the second amplifying unit, the divider, the combiner, the m divider, and the m combiner are each accommodated in individual housings.

2. The power amplifier according to claim 1, wherein:
   each of a plurality of amplifying circuits in the first amplifying unit of at least one set of the m sets is biased so as to operate in AB-class or B-class mode; and
   each of a plurality of amplifying circuits in the second amplifying unit of the at least one set of the m sets is biased so as to operate in C-class mode, the each of a plurality of amplifying circuits being included in the second amplifying unit, and
   the combiner of the at least one set of the m sets combines the output signal of the first amplifying unit and the output signal of the second amplifying unit so as to cause the first amplifying unit and the second amplifying unit to operate as a Doherty amplifier.

3. The power amplifier according to claim 1, wherein each of a plurality of amplifying circuits in the first amplifying unit and the second amplifying unit of at least one set of m sets is biased so as to operate in AB-class or B-class mode.

4. The power amplifier according to claim 1, wherein the first amplifying unit and the second amplifying unit further comprise:
- a variable attenuator that attenuates an input signal in accordance with a control signal supplied from outside; and
- a variable phase shifter that delays a phase of an input signal in accordance with a control signal supplied from outside.

5. The power amplifier according to claim 2, wherein the first amplifying unit and the second amplifying unit further comprise:
- a variable attenuator that attenuates an input signal in accordance with a control signal supplied from outside; and
- a variable phase shifter that delays a phase of an input signal in accordance with a control signal supplied from outside.

6. The power amplifier according to claim 3, wherein the first amplifying unit and the second amplifying unit further comprise:
- a variable attenuator that attenuates an input signal in accordance with a control signal supplied from outside; and
- a variable phase shifter that delays a phase of an input signal in accordance with a control signal supplied from outside.

* * * * *